(12) United States Patent
Hohe et al.

(10) Patent No.: US 6,583,613 B1
(45) Date of Patent: Jun. 24, 2003

(54) DEVICE AND METHOD FOR MEASURING AN ELECTRIC CURRENT

(75) Inventors: Hans-Peter Hohe, Heiligenstadt (DE); Norbert Weber, Weissenohe (DE); Josef Sauerer, Herzogenaurach (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 0 days.

(21) Appl. No.: 09/889,790

(22) PCT Filed: Jan. 17, 2000

(86) PCT No.: PCT/EP00/00316
§ 371 (c)(1),
(2), (4) Date: Jul. 18, 2001

(87) PCT Pub. No.: WO00/54063
PCT Pub. Date: Sep. 14, 2000

(30) Foreign Application Priority Data

Mar. 11, 1999 (DE) .......................... 199 10 801

(51) Int. Cl.⁷ .................................................. G01R 33/00
(52) U.S. Cl. .................................................. 324/117 R
(58) Field of Search .................. 324/117 R, 117 H, 324/127; 318/431, 430, 432, 433, 434, 903; 361/98, 100, 154, 187

(56) References Cited

U.S. PATENT DOCUMENTS

| | | | |
|---|---|---|---|
| 5,041,780 A | | 8/1991 | Rippel .......................... 324/117 |
| 5,438,256 A | * | 8/1995 | Thuries et al. .......... 324/117 R |
| 6,310,470 B1 | * | 10/2001 | Hebing .................... 324/117 R |

FOREIGN PATENT DOCUMENTS

| | | | |
|---|---|---|---|
| CH | 358157 | 12/1957 | |
| CH | 414 010 | 2/1964 | |
| EP | 597 404 | 11/1993 | ........... G01R/15/02 |
| EP | 874 244 | 3/1998 | ........... G01R/15/20 |
| FR | 2 670 015 | 12/1990 | ........... G01R/19/00 |
| GB | 2 064 140 | 6/1981 | |

OTHER PUBLICATIONS

Steiner, R., M. Schneider, F. Mayer, and U. Munch, Fully Packaged CMOS Current Monitor Using Lead–On–Chip Technology, IEEE, 1998.

* cited by examiner

*Primary Examiner*—Safet Metjahic
*Assistant Examiner*—Etienne P LeRoux
(74) *Attorney, Agent, or Firm*—Glenn Patent Group; Michael A. Glenn; Kirk D. Wong

(57) ABSTRACT

A current measuring device for measuring the current through one or a plurality of conductors (L1, L2, L3) of an array of n conductors, n being a natural number $\geq 2$, comprises n+1 magnetic-field-sensitive sensors (S1 to S4) which are arranged such that two respective magnetic-field-sensitive sensors are arranged adjacent a respective conductor. A unit (12) for reading out output signals of the magnetic-field-sensitive sensors is provided. Furthermore, the current measuring device is provided with a unit (10) for calculating the current through one or a plurality of conductors on the basis of the read output signals and on the basis of coefficients which describe the influence of currents flowing through each of the n conductors and of a constant magnetic field on the output signal of each of the magnetic-field-sensitive sensors.

11 Claims, 2 Drawing Sheets

DEVICE AND METHOD FOR MEASURING AN ELECTRIC CURRENT

The present invention relates to a device and a method for measuring an electric current and, in particular, to a device and a method for measuring the electric current flowing through one or a plurality of conductors of an array of several electric conductors which are arranged in close proximity to one another.

For potential-free current measurement it. is known to place two magnetic-field-sensitive sensors on both sides of an electric conductor. Such an arrangement is schematically shown in FIG. 1, where two magnetic-field-sensitive sensors 2 and 4 are arranged on both sides of an electric conductor 6. By means of the magnetic-field-sensitive sensors 2 and 4, the magnetic field generated by a current flowing through the conductor 6 is measured. The current in the conductor is determined by forming the difference between the output signals of the two magnetic-field-sensitive sensors 2 and 4; this principle permits an existing, gradient-free magnetic field to be eliminated when the current is being measured. The above-described arrangement is disadvantageous insofar as 2n sensors are required, when the currents in n conductors are to be measured simultaneously. The known method is also problematic when the currents through a plurality of conductors are to be measured and when the conductors are arranged in closely spaced relationship with one another. This will give rise to a magnetic field gradient at the location of a conductor due to the current of a neighbouring conductor so that the current measurement will be disturbed. The influence of the magnetic field gradient caused by the current in the neighbouring conductor cannot be compensated for.

It is the object of the present invention to provide a device and a method for measuring the current through one or a plurality of conductors of an array of n conductors making use of a reduced number of magnetic-field-sensitive sensors, which additionally permit an exact detection of the current through one of the conductors even if the individual conductors of the conductor array are arranged in close proximity to one another.

This object is achieved by a current measuring device according to claim 1 and a method according to claim 8.

The present invention provides a current measuring device for measuring the current through one or a plurality of conductors of an array of n conductors, n being a natural number$\geq 2$, in the case of which n+1 magnetic-field-sensitive sensors are arranged in such a way that two respective magnetic-field-sensitive sensors are arranged adjacent a respective conductor. Furthermore, a unit for reading out output signals of the magnetic-field-sensitive sensors is provided. Finally, the current measuring device is provided with a unit for calculating the current through one or a plurality of conductors on the basis of the read output signals and on the basis of coefficients which describe the influence of currents flowing through each of the n conductors and of a constant magnetic field on the output signal of each of the magnetic-field-sensitive sensors.

The present invention thus permits a reduction of the required magnetic-field-sensitive sensors from 2n to n+1, when the current flowing through n conductors is to be detected. In addition, the present invention permits a compensation of influences, which are caused by closely spaced, current-carrying conductors, on the current measurement in one conductor. It follows that the present invention provides, on the one hand, a relatively simple current measuring device, which provides, on the other hand, exact results in the case of electric conductors arranged in close proximity to one another.

The magnetic-field-sensitive sensors are preferably Hall sensors which are monolithically produced on a semiconductor substrate together with the evaluation electronics, i.e. the read-out unit and the calculating unit, and, preferably, together with a memory for storing the coefficients.

The present invention additionally provides a method of measuring the current through one or a plurality of conductors of an array of n conductors, n being a natural number$\geq 2$, wherein the output signals of n+1 magnetic-field-sensitive sensors are first read out, two respective ones of these sensors being arranged adjacent a respective conductor. Subsequently, the current through one or a plurality of the conductors is calculated on the basis of the read output signals and on the basis of coefficients which describe the influence of currents flowing through each of the n conductors and of a constant magnetic field on the output signal of each of the magnetic-field-sensitive sensors.

Preferred embodiments of the method according to the present invention additionally comprise the step of executing a calibration measurement so as to calculate the coefficients. In so doing, the coefficients are determined as matrix coefficients in such a way that a defined current is conducted through each of the conductors in turn while the other conductors do not carry a current. In addition, a further calibration measurement is carried out in the case of which a constant magnetic field, i.e. a gradient-free magnetic field having a known magnitude, is applied to the magnetic-field-sensitive sensors, while no current flows through the conductors. For calculating the current flowing through one or a plurality of the conductors, the sensor signals of all the magnetic-field-sensitive sensors are then linearly interconnected via a matrix operation making use of the coefficient matrix determined.

As has been mentioned hereinbefore, the magnetic-field-sensitive sensors are preferably Hall sensors. These Hall sensors are sensitive to perpendicularly impinging magnetic fields so that the sensors are arranged between the conductors or, displaced upwards or downwards, in the space between the conductors.

In addition, the present invention also permits the use of sensors which are sensitive to magnetic fields impinging parallel to the surface, e.g. field plates. These sensors are arranged in such a relation to the conductors that the magnetic field generated by the conductors impinges on the sensors substantially parallel to the surface thereof.

In the following, preferred embodiments of the present invention will be described in detail making reference to the drawings enclosed, in which.

Figure 1:
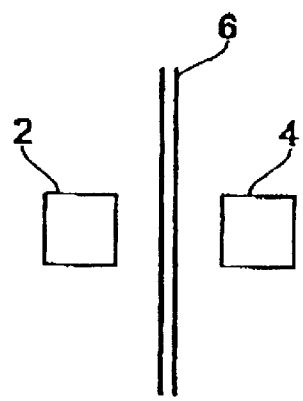
FIG. 1 shows schematically a known current measuring device.
Figure 2:
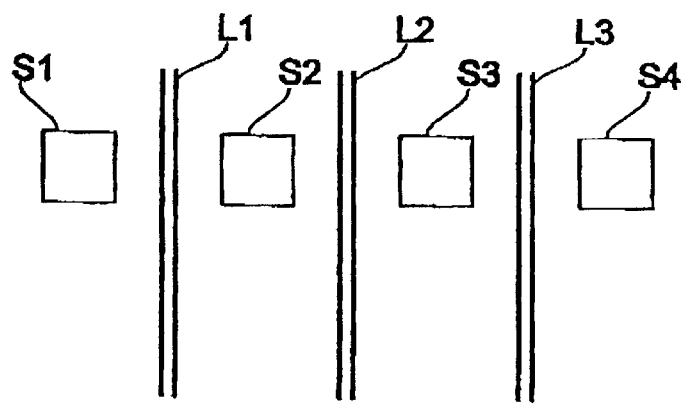
FIG. 2 shows schematically a current measuring device according to the present invention.

FIG. 2 shows schematically the array of magnetic-field-sensitive sensors according to the present invention used for measuring the current in three conductors L1, L2, L3 which are arranged in close proximity to one another. As can be seen in FIG. 2, only four magnetic-field-sensitive sensors S1, S2, S3 and S4 are required for measuring the currents in the conductors L1, L2, L3. The four sensors are arranged in such a way that two respective ones of the magnetic-field-sensitive sensors, e.g. S1 and S2, are arranged adjacent a respective conductor, e.g. L1. For detecting the current through one of the conductors, the output signals of all magnetic-field-sensitive sensors S1 to S4 are now linearly interconnected via a matrix operation, the matrix coefficients being determined via a calibration measurement in such a way that a defined current is conducted through each of the conductors in turn while the other conductors do not carry a current.

In addition, a calibration measurement is carried out in the case of which the array has applied thereto a known constant magnetic field while no current flows through the conductors.

The resultant matrix of coefficients reads:

| $a_{11}$ | $a_{12}$ | $a_{13}$ | $a_{14}$ |
|---|---|---|---|
| $a_{21}$ | $a_{22}$ | $a_{23}$ | $a_{24}$ |
| $a_{31}$ | $a_{32}$ | $a_{33}$ | $a_{34}$ |
| $a_{g1}$ | $a_{g2}$ | $a_{g3}$ | $a_{g4}$ |

The coefficients $a_{11}$ to $a_{14}$ are obtained while only the conductor L1 carries a known current, the coefficients $a_{21}$ to $a_{24}$ are obtained while only the conductor L2 carries a known current, and the coefficients $a_{31}$ to $a_{34}$ are obtained while only the conductor L3 carries a known current. The coefficients $a_{g1}$ to $a_{g4}$ are obtained wile a known constant magnetic field is applied and while none of the conductors carries a current.

The first number of the index of a respective coefficient stands for a conductor, whereas the respective second number in the index stands for a sensor so that e.g. the coefficient all describes the influence of a current through the conductor L1 on the output signal of the sensor S1. In the case of the coefficients $a_{g1}$ to $a_{g4}$ the letter g stands for the respective constant magnetic field so that these coefficients describe the influence of a constant magnetic field on the output signal of the respective sensor.

Making use of the above coefficients, the output signals $A_1$ to $A_4$ of the four magnetic-field-sensitive sensors S1 to S4 are composed as follows:

$$A_1 = a_{11} \cdot I_1 + a_{21} \cdot I_2 + a_{31} \cdot I_3 + a_{g1} \cdot Hg$$
$$A_2 = a_{12} \cdot I_1 + a_{22} \cdot I_2 + a_{32} \cdot I_3 + a_{g2} \cdot Hg$$
$$A_3 = a_{13} \cdot I_1 + a_{23} \cdot I_2 + a_{33} \cdot I_3 + a_{g3} \cdot Hg$$
$$A_4 = a_{14} \cdot I_1 + a_{24} \cdot I_2 + a_{34} \cdot I_3 + a_{g4} \cdot Hg$$

wherein $I_1$ stands for a current through the conductor L1, $I_2$ stands for a current through the conductor L2, $I_3$ stands for a current through the conductor L3 and Hg stands for an applied constant magnetic field.

The above equations can be represented as follows in the form of a matrix or in the form of vectors:

| $A_1$ |   | $a_{11}$ | $a_{12}$ | $a_{13}$ | $a_{14}$ | $I_1$ |
|---|---|---|---|---|---|---|
| $A_2$ | = | $a_{21}$ | $a_{22}$ | $a_{23}$ | $a_{24}$ | $I_2$ |
| $A_3$ |   | $a_{31}$ | $a_{32}$ | $a_{33}$ | $a_{34}$ | $I_3$ |
| $A_4$ |   | $a_{g1}$ | $a_{g2}$ | $a_{g3}$ | $a_{g4}$ | Hg |

After an inversion of the matrix of coefficients, the individual currents $I_1$ to $I_3$ flowing through the conductors L1 to L3 can therefore be calculated as follows:

| $I_1$ |   | $a_{11}$ | $a_{12}$ | $a_{13}$ | $a_{14}$ |   | $A_1$ |
|---|---|---|---|---|---|---|---|
| $I_2$ | = | $a_{21}$ | $a_{22}$ | $a_{23}$ | $a_{24}$ | · | $A_2$ |
| $I_3$ |   | $a_{31}$ | $a_{32}$ | $a_{33}$ | $a_{34}$ |   | $A_3$ |
| Hg |   | $a_{g1}$ | $a_{g2}$ | $a_{g3}$ | $a_{g4}$ |   | $A_4$ |

In this way, the current through each of the electric conductors L1 to L3 can be calculated precisely according to the present invention, only n−1 magnetic-field-sensitive sensors being necessary for this purpose, when the current through n conductors is to be measured. The above-mentioned calculating method additionally permits the detection of the constant magnetic field.

Figure 3:
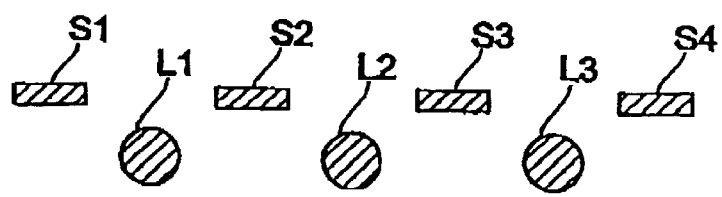
FIG. 3 shows schematically an alternative arrangement of Hall sensors for executing a current measurement according to the present invention.

FIG. 3 shows a schematic representation for illustrating an alternative array of magnetic-field-sensitive sensors with respect to three conductors in which a current is to be measured. Also in this case, four sensors S1 to S4 are arranged with respect to three conductors L1 to L3 in such a way that two respective magnetic-field-sensitive sensors are arranged adjacent a respective conductor. In this case, the sensors are, however, arranged such that they are displaced perpendicularly with respect to an imaginary line extending through the conductors, the sensors being e.g. displaced upwards or downwards with respect to the conductors. Such an arrangement can e.g. be realized easily when the sensors are Hall sensors and when they are monolithically produced on a semiconductor substrate together with the conductors. The conductor tracks L1 to L3 , which are shown in FIG. 3 only schematically with a round cross-section, may here be e.g. conductor tracks on top of which a dielectric layer is arranged, the magnetic-field-sensitive sensors being then arranged on this dielectric layer. The arrangement shown in FIG. 3, or an arrangement of the sensors directly between the conductors is used, when the sensors are sensitive to perpendicularly impinging magnetic fields.

Figure 4:
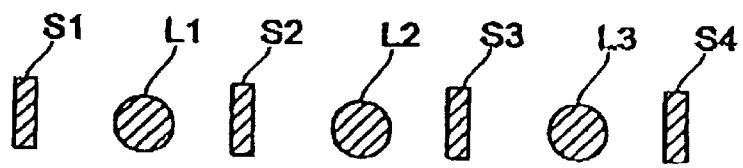
FIG. 4 shows an arrangement of field plates for executing a current measurement according to the present invention.

FIG. 4 shows an arrangement of sensors in relation to conductors in cases in which the sensors are sensitive to magnetic fields impinging parallel to the surface, as in the case of field plates by way of example. In this arrangement the field lines of a magnetic field, which is generated by currents through the conductors L1 to L3, extend parallel to the main surfaces of the sensors S1 to S4. Also in this case, only n+1 magnetic-field-sensitive sensors will be necessary for measuring the currents through n conductors.

Figure 5:
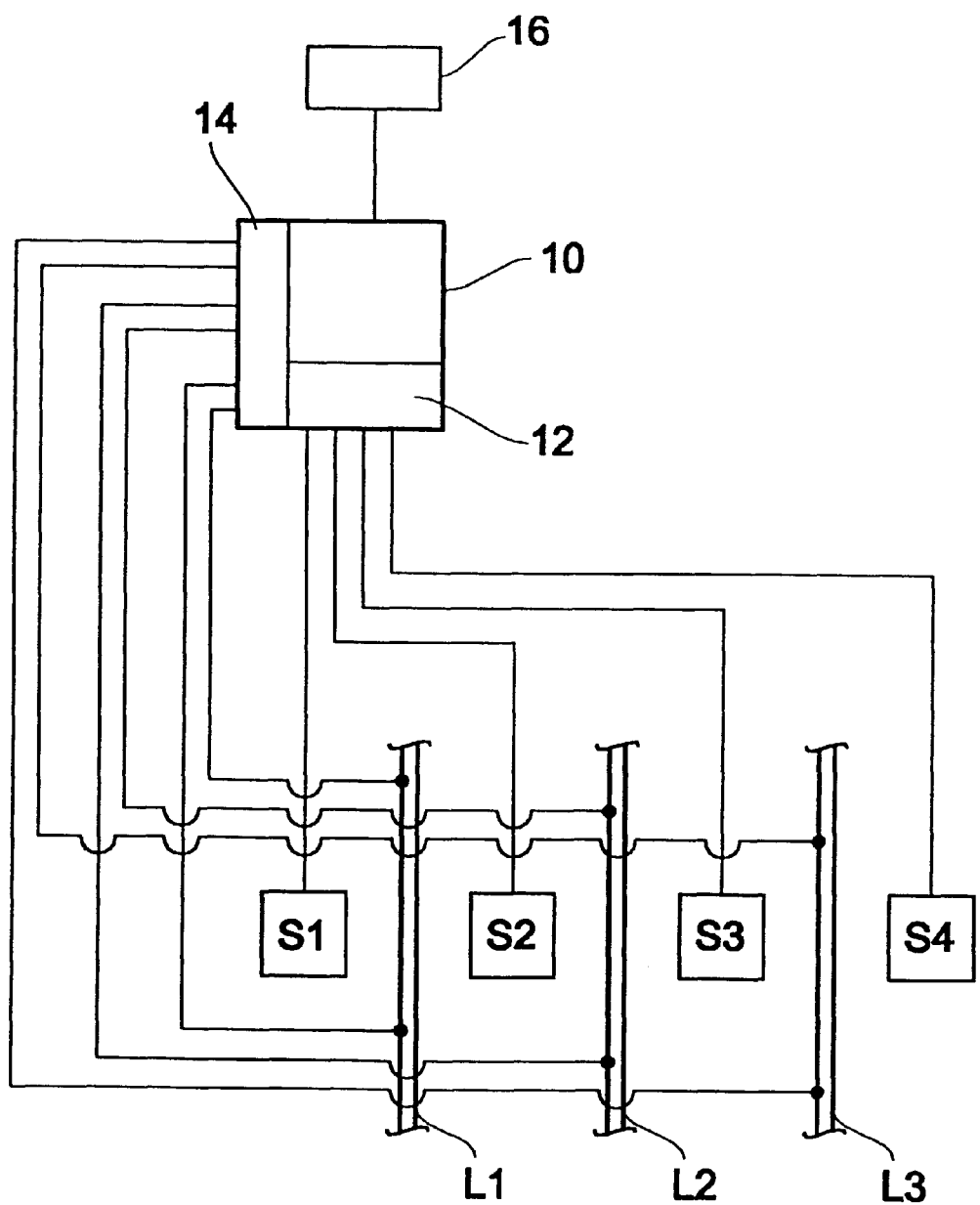
FIG. 5 shows a schematic representation of the current measuring device according to the present invention.

A schematic general representation of a current measuring device according to the present invention is shown in FIG. 5. The arrangement of the three conductors L1 to L3 and of the four magnetic-field-sensitive sensors S1 to S4 can be seen once more in this representation. The magnetic-field-sensitive sensors S1 to S4 are each connected to an evaluation unit 10. More specifically, the sensors S1 to S4 are connected to a read-out unit 12 of the evaluation unit. In the evaluation unit 10 the above-described calculation of the current flowing through the respective conductors L1 to L3 is carried out. In addition, the evaluation unit 10 is preferably provided with a calibration unit 14 by means of which the above-described coefficients are determined. For this purpose, the calibration unit 14 is connected in a suitable manner to the respective conductors L1 to L3 so as to be able to cause a known flow of current through these conductors. This is shown in FIG. 5 by the schematically shown conductors between the calibration unit 14 and the respective conductors L1 to L3. Furthermore, a means for generating a known constant magnetic field (not shown) is preferably provided so as to permit the coefficients $a_{g1}$ to $a_{g4}$ to be determined. Alternatively, each of these coefficients may be given the value 1 or some other predetermined value. In addition, the evaluation unit 10 preferably comprises a memory 16 in which the coefficients determined are stored preferably in the form of a matrix. The coefficients can either be stored in the form determined; preferably, however, the elements of the inverted matrix are first calculated from the coefficients determined, these elements being then stored in the memory 16. It is apparent that the memory 16 may be integrated in the evaluation unit 10, although it is shown separately from this evaluation unit in FIG. 5.

It follows that the present invention provides a current measuring device and a method for measuring a current, respectively, in the case of which only n+1 magnetic-field-sensitive sensors are required for measuring the current through n conductors. Although the figures only show conductors L1 to L3 which are arranged in juxtaposition, the present invention can also be applied to conductor arrays in which the conductors extend at right angles to one another, e.g. in a multilayered substrate; also in this case, only n+1 magnetic-field-sensitive sensors are required.

What is claimed is:

1. A current measuring device for measuring a current through one or a plurality of conductors of an array of n conductors, with n being a natural number and n≧2, comprising the following features:

n+1 magnetic-field-sensitive sensors which are arranged in such a way that two respective magnetic-field-sensitive sensors are arranged adjacent a respective conductor;

a unit for reading out output signals of the magnetic-field-sensitive sensors; and a unit for calculating the current through one or a plurality of conductors on the basis of the read output signals and on the basis of coefficients which describe the influence of currents flowing through each of the n conductors and of a constant magnetic field on the out-put signal of each of the magnetic-field-sensitive sensors.

2. A current measuring device according to claim 1, wherein the magnetic-field-sensitive sensors (S1 to S4) are arranged such that each conductor (L1 to L3) is arranged between two of said magnetic-field-sensitive sensors.

3. A current measuring device according to claim 1, wherein a plane is defined by the conductors in which the conductors are arranged and wherein the magnetic-field-sensitive sensors are arranged external to the plane defined by the conductors.

4. A current measuring device according to one of the claims 1 to 3, wherein the magnetic-field-sensitive sensors (S1 to S4) are Hall sensors.

5. A current measuring device according to claim 4, wherein the Hall sensors, together with the read-out unit (12) and the calculating unit (10), are monolithically integrated on a semiconductor substrate.

6. A current measuring device according to one of the claims 1 to 5, wherein the coefficients in the form of a matrix are stored in a memory means (16).

7. A current measuring device according to claim 6 referring back to claim 5, wherein the memory means (16) is integrated on the semiconductor substrate.

8. A method of measuring the current through one or a plurality of conductors of an array of n conductors, with n being a natural number and n≧2, comprising the following steps:

reading out the output signals of n+1 magnetic-field-sensitive sensors, two respective ones of said sensors being arranged adjacent a respective conductor;

calculating the current through one or a plurality of the conductors an the basis of the read output signals and on the basis of coefficients which describe the influence of currents flowing through each of the n conductors and of a constant magnetic field on the output signal of each of the magnetic-field-sensitive sensors.

9. A method according to claim 8, comprising in addition the step of determining the coefficients on the basis of the output signal of each of the magnetic-field-sensitive sensors (S1 to S4) while a known flow of current is successively caused through each of the conductors, whereas no current flows through the rest of the conductors, and on the basis of the output signal of each of the magnetic-field-sensitive sensors (S1 to S4) during application of a known constant magnetic field, while no current flows through the conductors.

10. A method according to claim 9, comprising in addition the step of storing the coefficients.

11. A method according to claim 8, wherein the calculation step comprises the execution of a linear interconnection of the output signals of the magnetic-field-sensitive sensors by means of a matrix operation, the coefficients which describe the influence of currents flowing through each of the n conductors and of a constant magnetic field on the output signal of each of the magnetic field-sensitive sensors being used as matrix coefficients.

* * * * *